United States Patent
Chen et al.

(10) Patent No.: US 9,881,875 B2
(45) Date of Patent: Jan. 30, 2018

(54) ELECTRONIC MODULE AND METHOD OF MAKING THE SAME

(71) Applicant: UNIVERSAL SCIENTIFIC INDUSTRIAL (SHANGHAI) CO., LTD., Shanghai (CN)

(72) Inventors: Jen-Chun Chen, Nantou County (TW); Tsung Jung Cheng, Nantou County (TW); Chia Cheng Liu, Nantou County (TW)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 557 days.

(21) Appl. No.: 14/332,970

(22) Filed: Jul. 16, 2014

(65) Prior Publication Data

US 2015/0036297 A1    Feb. 5, 2015

Related U.S. Application Data

(63) Continuation-in-part of application No. 13/955,149, filed on Jul. 31, 2013.

(30) Foreign Application Priority Data

Jul. 31, 2013 (TW) ............................ 102127507 A
Feb. 21, 2014 (TW) ............................ 103105827 A (51) Int. Cl.
*H05K 3/28* (2006.01)
*H01L 23/552* (2006.01)
(Continued)

(52) U.S. Cl.
CPC ............ *H01L 23/552* (2013.01); *H01L 21/56* (2013.01); *H01L 23/3121* (2013.01);
(Continued)

(58) Field of Classification Search
CPC ... H01L 23/552; H01L 21/56; H01L 23/3121; H01L 23/49805; H01L 27/14618; H01L 2924/0002; Y10T 29/49146
See application file for complete search history.

(56) References Cited

U.S. PATENT DOCUMENTS

| 5,022,960 A | * | 6/1991 | Takeyama | ............ H01L 21/4803 216/13 |
| 5,314,709 A | * | 5/1994 | Doany | ...................... G03F 7/12 216/58 |

(Continued)

FOREIGN PATENT DOCUMENTS

| CN | 102074516 A | 5/2011 |
| CN | 103053021 A | 4/2013 |

(Continued)

OTHER PUBLICATIONS

Office Action on counterpart Japanese Patent Application No. 2014-156811 dated Jul. 7, 2015, 2 pages.

(Continued)

*Primary Examiner* — Galen H Hauth
(74) *Attorney, Agent, or Firm* — Foley & Lardner LLP; Cliff Z. Liu (57) ABSTRACT

A method of manufacturing electronic module is provided. The method can perform selective partial molding by forming the tapes in a predetermined area on the circuit substrate, setting electronic components out the predetermined area on the circuit substrate, forming the molding member encapsulating the whole circuit substrate and removing the tapes along of the molding member thereon. Following, forming an EMI shielding layer on the molding member and setting optoelectronics in the predetermined area on the circuit substrate could protect the electronic components from electromagnetic disturbance and avoid the optoelectronics being encapsulated.

18 Claims, 10 Drawing Sheets

(51) Int. Cl.
   *H01L 27/146*   (2006.01)
   *H01L 23/498*   (2006.01)
   *H01L 23/31*    (2006.01)
   *H01L 21/56*    (2006.01)

(52) U.S. Cl.
   CPC .. *H01L 23/49805* (2013.01); *H01L 27/14618* (2013.01); *H01L 2924/0002* (2013.01); *Y10T 29/49146* (2015.01)

(56) References Cited

U.S. PATENT DOCUMENTS

| | | | | |
|---|---|---|---|---|
| 6,567,439 | B1* | 5/2003 | Auracher | H01L 24/49 372/36 |
| 8,030,750 | B2 | 10/2011 | Kim et al. | |
| 2006/0152913 | A1* | 7/2006 | Richey | H05K 1/0218 361/818 |
| 2010/0078822 | A1* | 4/2010 | Bauer | H01L 21/561 257/773 |
| 2010/0314755 | A1* | 12/2010 | Kang | H05K 3/46 257/737 |
| 2011/0115066 | A1 | 5/2011 | Kim et al. | |
| 2012/0292772 | A1 | 11/2012 | Yorita et al. | |
| 2013/0049205 | A1 | 2/2013 | Meyer et al. | |
| 2013/0155639 | A1 | 6/2013 | Ogawa et al. | |
| 2014/0190930 | A1* | 7/2014 | Mayo | H05K 3/284 216/13 |

FOREIGN PATENT DOCUMENTS

| | | |
|---|---|---|
| EP | 1 178 712 A2 | 2/2002 |
| JP | 2007-059846 | 3/2007 |
| JP | 2012-159935 | 8/2012 |
| TW | 201119003 A1 | 6/2011 |
| WO | WO-2012/023332 | 2/2012 |

OTHER PUBLICATIONS

Office Action and Search Report for Chinese Patent Application No. 201410072755.2, dated Aug. 24, 2016, 6 pages.
Taiwan Patent Office, Office action dated Sep. 29, 2014.
Non-Final Office Action for U.S. Appl. No. 13/955,149, dated Nov. 17, 2016.
Final Office Action for U.S. Appl. No. 13/955,149, dated Apr. 17, 2017.
Notice of Allowance for U.S. Appl. No. 13/955,149, dated Jul. 10, 2017.

\* cited by examiner

ELECTRONIC MODULE AND METHOD OF MAKING THE SAME

CROSS REFERENCE TO RELATED APPLICATION

This application is a continuation-in-part of U.S. application Ser. No. 13/955,149 filed on Jul. 31, 2013 and entitled "METHOD OF MANUFACTURING ELECTRONIC PACKAGE MODULE", now in condition for allowance.

BACKGROUND

1. Field of the Invention

The instant disclosure relates to an electronic module and method of making the same; in particular, to an electronic module having selective molding and method making the same.

2. Description of Related Art

Conventional electronic module includes a plurality of electronic components disposed on a circuit board. In addition, the electronic component modules may include molding material to encapsulate the electronic components for protection.

However, some electronic components like connectors or optoelectronics are not suitable for encapsulation, for example, the CMOS image sensor (CIS), charge-coupled device (CCD), and light emitting diode (LED). In order to protect some electronic components and remain the function of other components that are not suitable for encapsulation, a "partial molding" is then developed.

Conventional "partial molding" is achieved by mold chase, and the molding material is added to form the molding member. However, because of fluid adhesion, the molding material tends to form air bubbles or void at the mold cavity or the gap between the components and the circuit board. The air bubbles or the voids with moisture and in the following heating process they may cause "popcorn" issue which leads to low yield rate. Furthermore, after molding is completed by the mold chase, the mold chase has to be removed. For removing the mold chase, a draft angle has to be preserved when designing the mold chase. Typically, the acute angle between the mold and the circuit board is approximately 70 degree which reduces the overall usage of the printed circuit board. Moreover, whenever there is a different configuration, such as irregular shape of the molding, the mold chase has to be redesigned. Therefore, the cost is increased and the design consideration of mold chase becomes more complicated.

BRIEF SUMMARY OF THE INVENTION

The instant disclosure provides an electronic module and method of making the same for selective molding electronic components.

According to one embodiment of the instant disclosure, the method includes: providing a circuit substrate. The circuit substrate includes a first surface, at least one first ground pad and a first predetermined area disposed on the first surface. Then, a first tape is formed onto the first predetermined area. Next, at least one electronic component is disposed outside the first predetermined area. After then, a first molding member is formed. The first molding member covers the first tape and the electronic components. Subsequently, the first molding member and the first tape above the first predetermined area are removed.

In the step of forming the tape on the predetermined area, a tape is attached on the entire circuit substrate. Then, laser is used to trench the tape above the ground pad. Subsequently, the tape outside the first predetermined area is removed, such that in the predetermined area, the tape remains.

In the step of removing the molding member, laser may be used to trench the molding member above the ground pad that surrounds the predetermined area.

In the step of removing the molding member, laser may be used to trim the molding member above the predetermined area.

In the step of removing the tape above the predetermined area, heating may be used to facilitate the process.

The tape may be UV tape. In the step of removing the tape above the predetermined area, UV light may be used to shine on the tape and removed thereby.

The method of manufacturing the electronic module may further includes disposing the optoelectronic, connector or the like that are not suitable to be encapsulated on the predetermined area. According to an embodiment, after the removal of the tape, a mask layer is formed within the predetermined area and not covers the ground pad, and further formed the EMI shielding layer entirely and electrically connected to the ground pad. Then the mask layer is removed, and the optoelectronic is disposed on the predetermined area. After laser trenches the molding member above the ground pad, the entire area is formed with EMI shielding layer. The EMI shielding layer and the ground pad are electrically connected, and the tape in the predetermined area is then removed. The optoelectronic is subsequently disposed on the predetermined area.

The circuit substrate may further include side ground pads, and the EMI shielding layer and the side ground pad are electrically connected.

The electronic module of the instant disclosure may further include a circuit substrate, electronic components, molding members, an EMI shielding layer, optoelectronics and side ground pads. The circuit substrate includes a surface, ground pad and a predetermined area. The predetermined area and the ground pad are disposed on the surface. The electronic components are disposed on the surface outside the predetermined area. The molding member encapsulates the electronic components and each side of the molding member and the surface form an angle between 85 and 90 degrees. The EMI shielding layer covers the molding member, and it is electronically connected to the ground pad. The optoelectronics are disposed on the surface of the predetermined area. The side ground pad is disposed on a side of the circuit substrate, and the EMI shielding layer is electrically connected to the side ground pad.

By the abovementioned arrangement, the method of manufacturing electronic module can undergo selective molding without complex molds or procedure. The area that requires molding are formed with molding member and metal coating, such that electromagnetic interference (EMI) is avoided, and the optoelectronics are less likely to be affected by the molding members.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE INVENTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
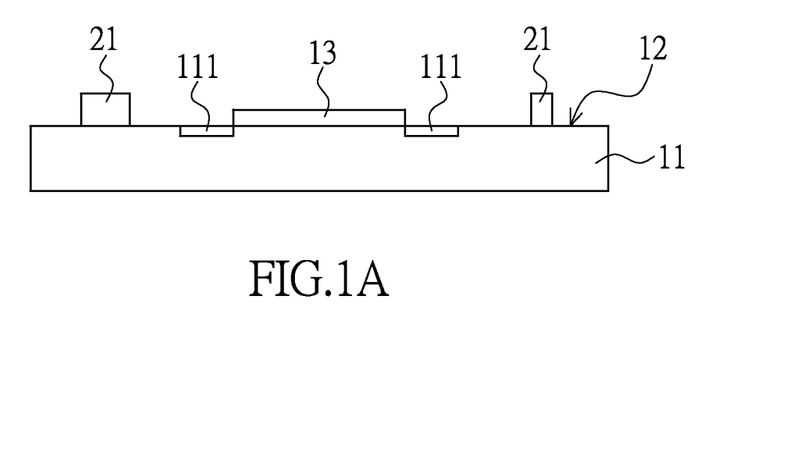
FIGS. 1A-1E are schematic views showing the steps of manufacturing electronic module in accordance with an embodiment of the instant disclosure.
Figure 1B:
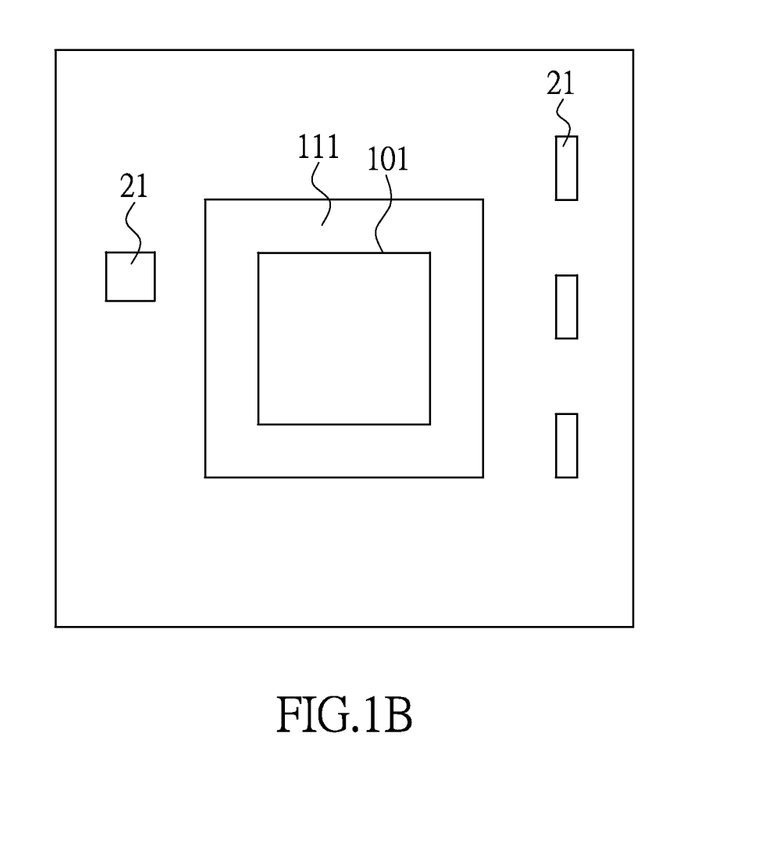
Figure 1C:
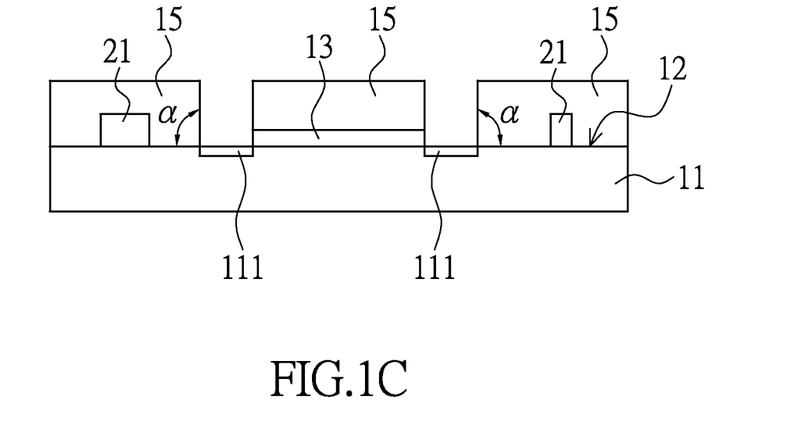
Figure 1D:
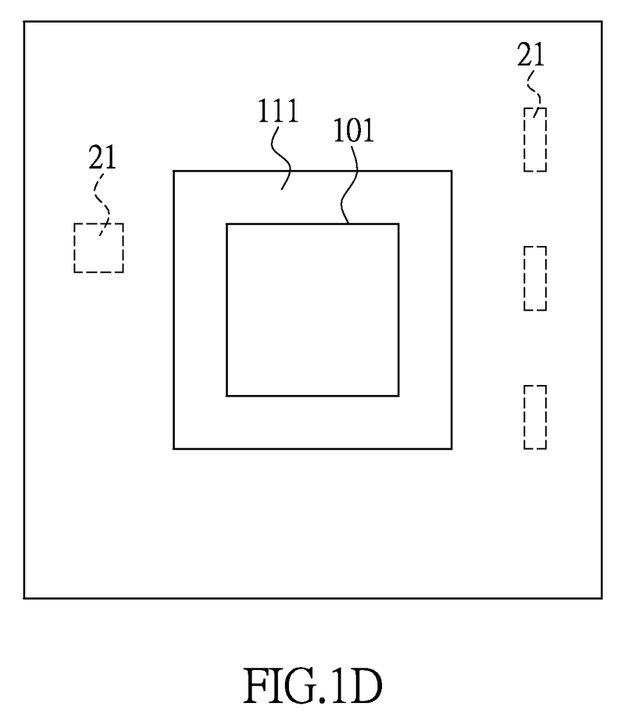
Figure 1E:
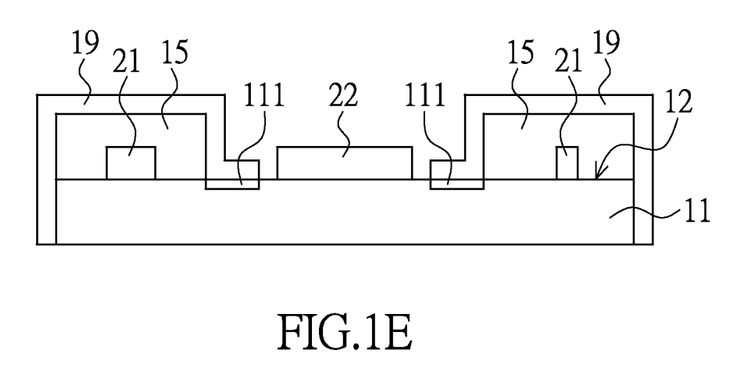

Please refer to FIGS. 1A-1E. FIGS. 1A, 1C and 1E are cross-sectional view of a method of manufacturing electronic module in accordance with an embodiment. FIGS. 1B and 1D are top view of the method of manufacturing electronic module of the embodiment.

In this embodiment, please refer to FIGS. 1A and 1B. The method of manufacturing electronic module of the instant disclosure includes, firstly, preparing a circuit substrate 11. The circuit substrate 11 has a surface 12, a predetermined area 101 on the surface 12 and ground pad 111. The position of the ground pad 111 can be used to define the predetermined area and the non-predetermined area. In the present embodiment, the ground pad 111 surrounds the predetermined area, and in another embodiment, the width of the ground pad 111 is 200 μm, but the instant disclosure is not limited thereto. The position, shape and dimension of the ground pad 111 are subject to change for different requirement.

Firstly of all, in order to form tape within the predetermined area, a suitable sized tape can be attached to the predetermined area 101. Alternatively, a large piece of tape can be attached to the entire circuit substrate 11, and laser is used to trench the tape to the peripheral region of the predetermined area, and then the partial tape outside the predetermined area 101 is removed, such that tape 13 is only present within the predetermined area 101.

The electronic component 21 is disposed on the surface 12 outside the predetermined area 101. It can be disposed by surface mount technology (SMT), and the electronic component 21 may be other elements other than optoelectronic, such as all kinds of active, passive components and the instant disclosure is not limited thereto. The optoelectronic in this specification refers to any components that are not suitable to be encapsulated by molding member, for example, CMOS image sensor, CCD, light emitting diode, connector, insertion hole, receptacle or the like. In addition, components that are suitable to be encapsulated are referred to as electronic components.

Figure 2:
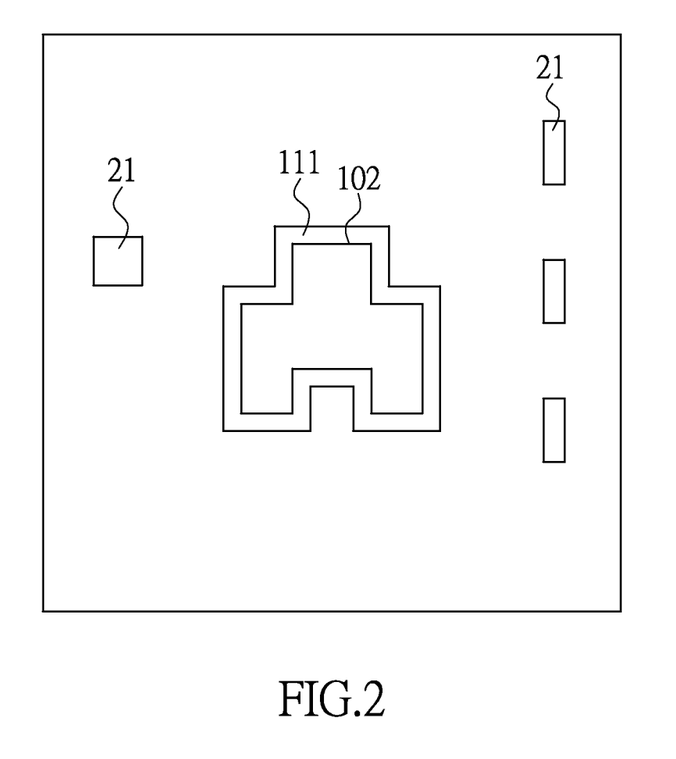
FIG. 2 is a top view of an electronic module with an irregular area formed by a method of manufacturing electronic module in accordance with an embodiment of the instant disclosure.

Please refer to FIG. 2. FIG. 2 is a top view of an electronic module with an irregular area formed by a method of manufacturing electronic module in accordance with an embodiment of the instant disclosure. The predetermined area 102 in FIG. 2 is irregular. The predetermined area is not limited by number, area size or shape. The predetermined area is used for locating optoelectronics, connector or the like that are not suitable to be encapsulated by the molding member 15 in the following process. The following implementation is adaptable to the predetermined areas 101 and 102.

After the abovementioned step shown in FIGS. 1A and 1B, such as the step of forming tape within the predetermined area and the step of disposing at least one electronic component 21, the molding member 15 is formed on the entire circuit substrate 11. The molding member 15 covers the tape 13 along with the circuit substrate 11 and the electronic components 21 outside the predetermined area 101 and ground pad 111. The formation of the molding member 15 is achieved by transfer molding or injection molding. The coverage of the tape 13 may overlap the ground pad 111 or immediately adjacent to the ground pad 111 without overlapping, and the instant disclosure is not limited thereto.

Please refer to FIGS. 1C and 1D. After the formation of molding member 15, laser is used to trench around the peripheral region of the predetermined area 101. In other words, a trench is cut along the ground 111. In an embodiment, the width of the trench is approximately 100 μm. The ground pad 111 is a metal layer, and the main material of the molding member 15 may include resin. Because of the different laser absorption level between the ground pad 111 and molding member 15, the ground pad 111 may act as a stop for laser cutting. However, the instant disclosure is not limited to this approach, and any means that cuts the molding member 15 alone and leaves the circuit substrate 11 is acceptable. For example, contour cutting may also be used to trench the molding member 15. It should be noted that in the instant disclosure, laser cutting is used, and the molding member does not need to reserve for a draft angle (e,g, approximately 20 degree). Therefore, after trenching, the side wall of the molding member 15 and the surface 12 form an angle α ranging between 85 and 90 degree. Compared to the conventional electronic module, the angle α is closer to 90 degree.

If the tape is a thin film, for example, thickness ranging between 20 and 50 micrometer (μm), when the tape 13 is removed, the molding member 15 remains on the circuit substrate 11 outside the predetermined area. The tape 13 may be heat tape or UV tape. If the tape is a heat tape, it can be removed by heating. In an embodiment, it is heated to 175° C., and the tape is removed by any pickup device. If the tape is a UV tape, the tape can be removed by shining UV light, and the instant disclosure is not limited to these two types of tapes.

In another embodiment of the instant disclosure, the tape is a thick film, for example, thickness being 0.2 mm. After laser trenches the molding member 15 on the predetermined area, laser is used to trim the molding member 15 on the predetermined area (i.e., the molding member 15 above the tape 13). In other words, after the molding member 15 on the predetermined area 101 is removed, the tape 13 is then removed, such that only the molding member 15 remains on the circuit substrate 11 outside the predetermined area 101.

In another embodiment of the instant disclosure, the molding member 15 outside the predetermined area 101 covers with the EMI shielding layer 19 and is electrically connected to the ground pad 111, and the optoelectronic 22 is disposed on the predetermined area 101.

Figure 3A:
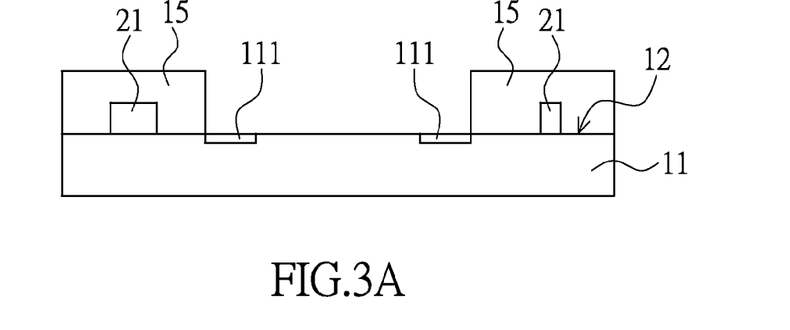
FIGS. 3A-3E are cross-sectional views of the steps of forming electronic module with optoelectronics in an predetermined area in accordance with an embodiment of the instant disclosure.
Figure 3B:
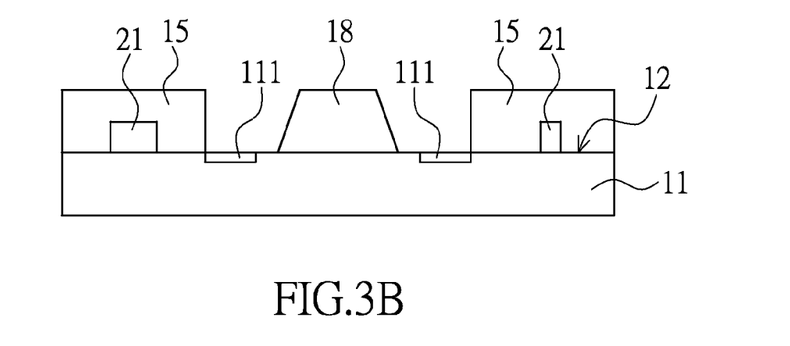
Figure 3C:
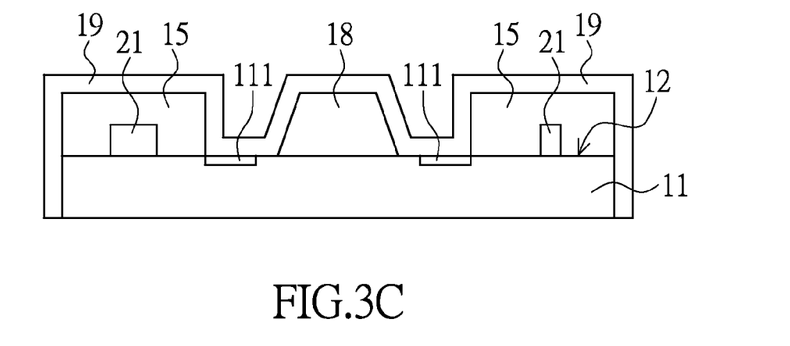
Figure 3D:
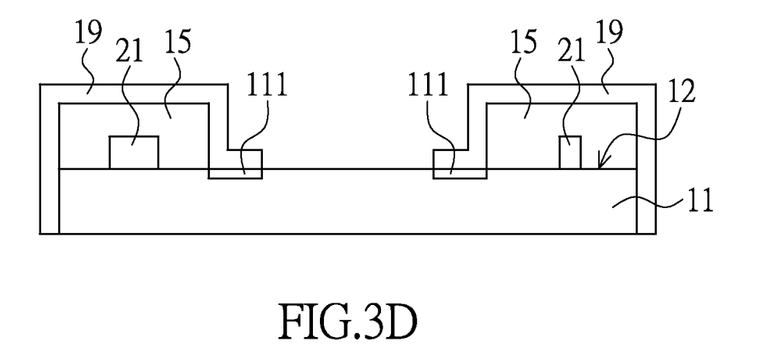
Figure 3E:
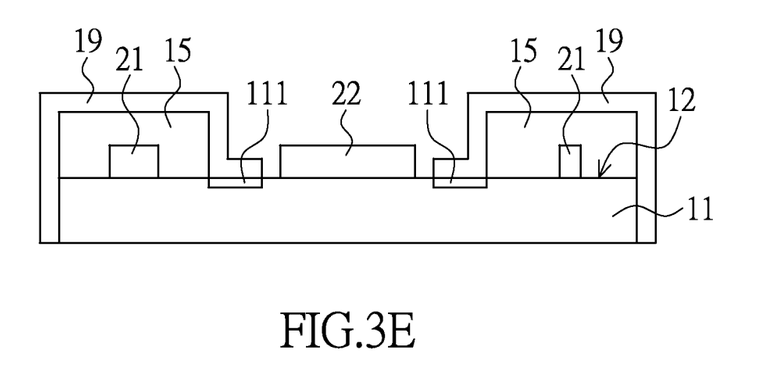

Please refer to FIGS. 3A to 3E showing the processes and corresponding cross-sectional views of forming electronic module with the optoelectronic 22 within the predetermined area 101. In the instant embodiment, after the tape 13 is removed (as shown in FIG. 3A), a mask layer 18 is disposed on the surface 12 within the predetermined area 101 and does not cover the ground (as shown in FIG. 3B). The material of the mask layer 18 is not limited as long as it can be easily removed. Subsequently, an entire EMI shielding layer 19 is formed (as shown in FIG. 3C). The EMI shielding layer 19 may be formed by spray coating, electroless plating or sputtering, and the instant disclosure is not limited thereto as long as the EMI shielding layer 19 and the ground pad 111 keep electrical connection. In this regard, once the mask layer 18 is removed, the EMI shielding layer 19 covers the molding member 15 outside the predetermined area 101 and is electrically connected to ground pad 111 (as shown in FIG. 3D), such that EMI shielding function can be offered to the electronic component 21. Then, the optoelectronic 22 is disposed within the predetermined area 101 (as shown in FIG. 3E), the optoelectronic 22 may be disposed by surface mount technology (SMT), and the instant disclosure is not limited thereto. Accordingly, the optoelectronic 22 is not encapsulated by the molding member, and the optoelectronic 22 is free from electromagnetic interference (EMI).

Figure 4A:
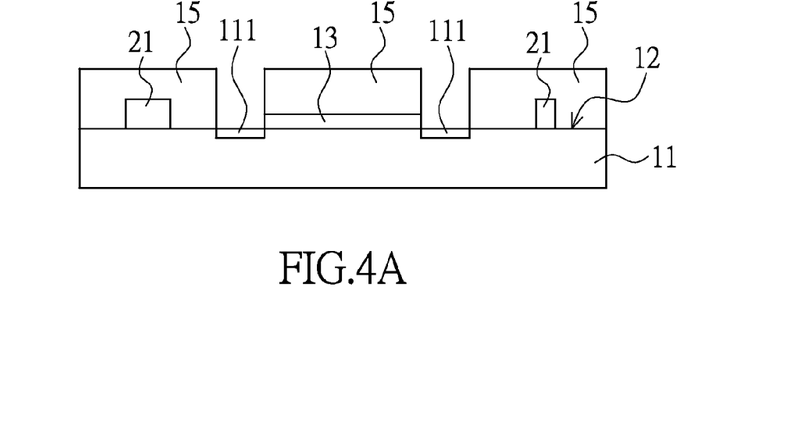
FIGS. 4A-4D are cross-sectional views of the steps of forming electronic module with optoelectronics in an predetermined area in accordance with another embodiment of the instant disclosure.
Figure 4B:
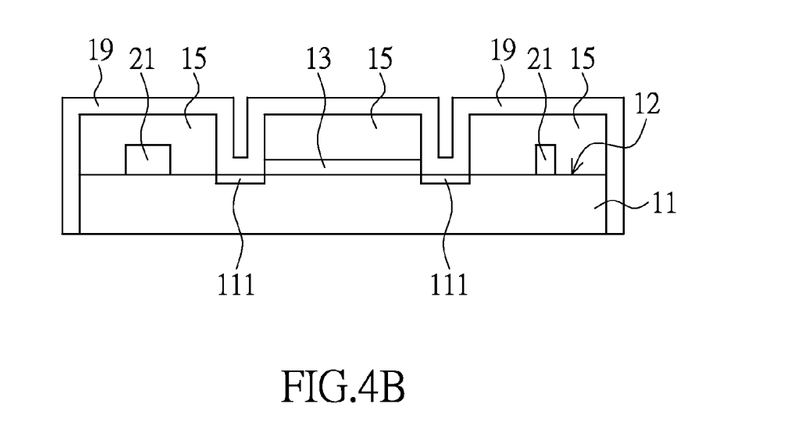
Figure 4C:
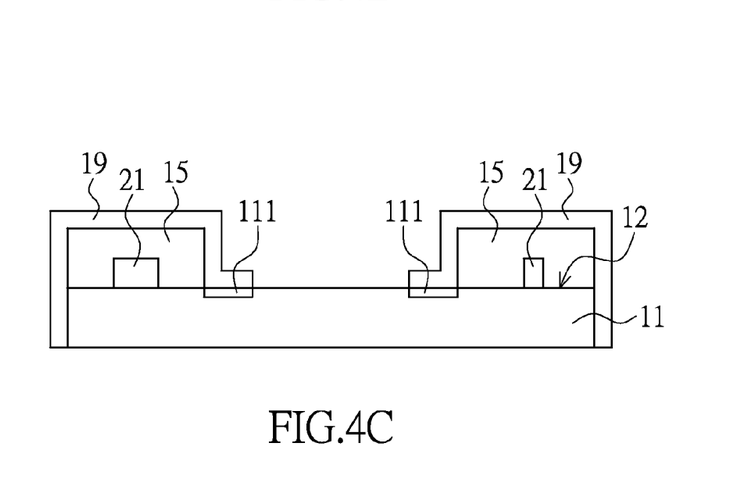
Figure 4D:
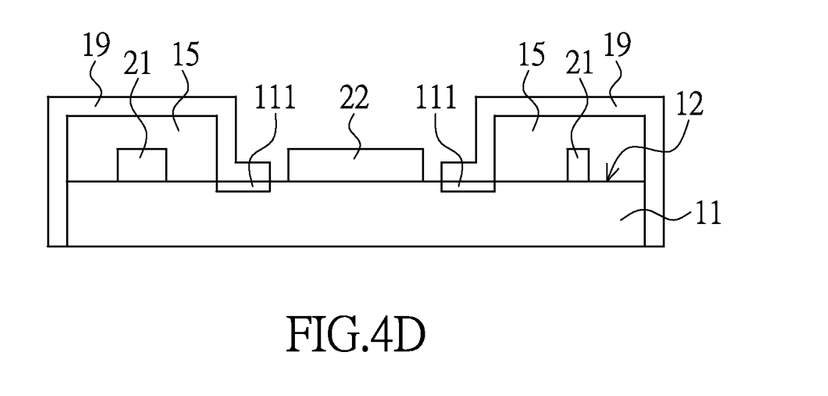

In another embodiment of the instant disclosure, please refer to FIGS. 4A to 4D. FIGS. 4A to 4D show the processes and corresponding cross-sectional views of forming electronic module with optoelectronic 22 within the predetermined area 101. In the instant embodiment, after laser trenches the molding member 15 surrounding the predetermined area 101 (as shown in FIG. 4A), the entire EMI shielding layer 19 is formed (as shown in FIG. 4B). The formation of the EMI shielding layer 19 is identical as previously mentioned. The EMI shielding layer 19 should be electrically connected to the ground pad 111. Next, the tape 13 is removed, and the molding member 15 outside the predetermined area 101 is covered with the EMI shielding layer 19 and is electrically connected to the ground pad 111 (as shown in FIG. 4C), such that EMI shielding function can be provided. Then, the optoelectronic 22 is disposed within the predetermined area 101 (as shown in FIG. 4D). In practical, in the situations such as the distance between each molding member 15 or the height of the molding member 15 will be result in electrical disconnection of EMI shielding layer 19 and ground pad 111, the embodiment as shown in FIGS. 3A to 3E could be used to in place of directly forms the EMI shielding layer 19 as shown in FIGS. 4A to 4B.

Figure 5:
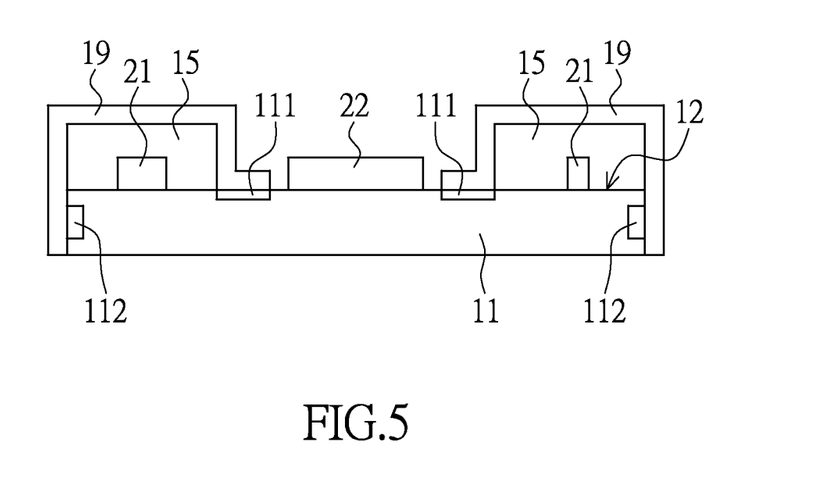
FIG. 5 is a cross-sectional view of an electronic module including side ground pads in accordance with an embodiment of the instant disclosure.

In addition, for increasing the effectiveness of the protection against electromagnetic interference, the electronic module may further include at least one side ground pad 112 disposed on a side of the circuit substrate 11 and electrically connected to EMI shielding layer 19 as shown in FIG. 5.

Figure 6A:
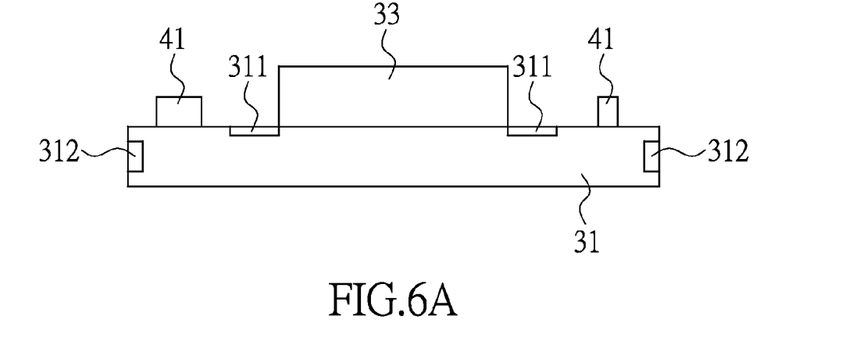
FIGS. 6A-6I are cross-sectional views showing a method for manufacturing electronic module implementing on a two-sided molding in accordance with an embodiment of the instant disclosure.

The instant disclosure also provides a method of manufacturing double-sided electronic module by using the aforementioned process. Most of the process detail can be referred back to the previous embodiments. Please refer to FIGS. 6A to 6I. In FIG. 6A, the electronic component 41 is disposed on a first surface of the circuit substrate 31 outside the predetermined area. The tape 33 is attached within the predetermined area. The ground pad 311 surrounds the predetermined area, and the side ground pad 312 is disposed around the side of the substrate 31. If the height of electronic component 41 is relatively shorter, the tape 33 attached to the first surface can be a thicker tape, and its thickness may be slightly higher than the electronic component 41.

Figure 6B:
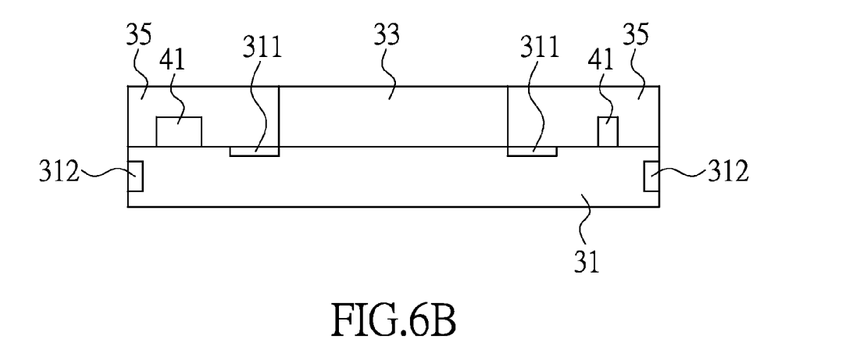

Subsequently, the first surface of the circuit substrate 31 is formed with the molding member 35. Because the tape 33 is thicker, the height of the molding member 35 is approximately the same as the tape 33, such that the molding member 35 can completely encapsulate the electronic component 41, as shown in FIG. 6B. In addition, because the height of the molding member 35 is the same as the tape 33, in the following formation of the EMI shielding layer 39, the tape does not need to be removed and sputtering can be performed straight afterwards.

Figure 6C:
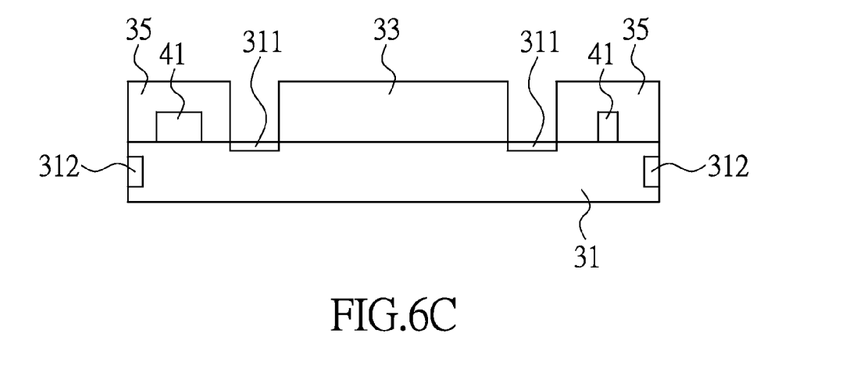

Then, the molding member 35 formed on the first surface of the circuit substrate 31 is trenched, as shown in FIG. 6C. For the convenience of the following formation of the EMI shielding layer 39, the trench is wider for easier coating.

Figure 6D:
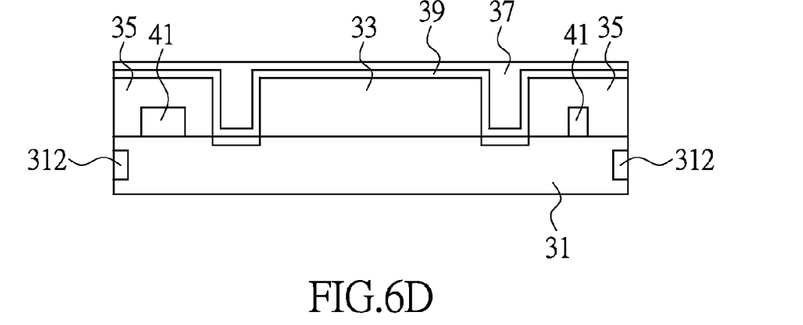

After that, the trenched molding member 35 on the first surface of the circuit substrate 31 undergoes coating and is covered with a layer of ink 37, as shown in FIG. 6D. The ink 37 serves to prevent any contamination from dust or foreign particles occurring to where it covers. The ink 37 can be washed off by chemical solvent, and the particles thereon can be rinsed off at the same time. The layer underneath the ink layer is therefore clean.

Figure 6E:
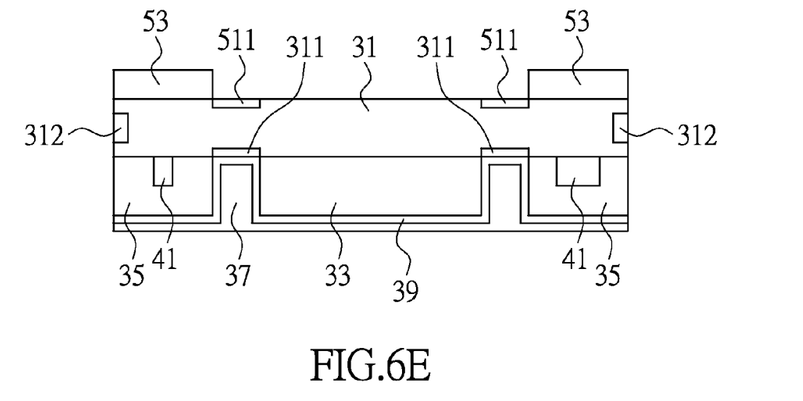

Please refer to FIG. 6E. The circuit substrate 31 is turned over to the other side, and starts to mold the second surface of the circuit substrate 31. The second surface is opposite to the first surface. The tape 53 is attached to the predetermined area on the second surface. In the embodiment, the predetermined area on the second surface surrounds the non-predetermined area. However, the shape of the predetermined area is not limited to the present disclosure. The ground pad 511 can be disposed around the non-predetermined area to act as a stop for laser cutting, in other words, the ground pad 511 is located between the predetermined area and the non-predetermined area. In this embodiment, the height of electronic component 61 disposed outside the predetermined area of the second surface relatively higher than that of electronic component 41 on the first surface, so that a thinner tape 53 could be used at the second surface for attaching on predetermined area. It should be noted that in the instant embodiment, two sides of the circuit substrate 31 (i.e. the first and second surface) are used to describe a preferable implementation, and the instant disclosure is not limited thereto. The height of the electronic components and the position of the predetermined area are not dependent to each other. The combination of the height of the electronic component and the thickness of the tape is decided in relation to a more convenient process, and it may be subject to change.

Figure 6F:
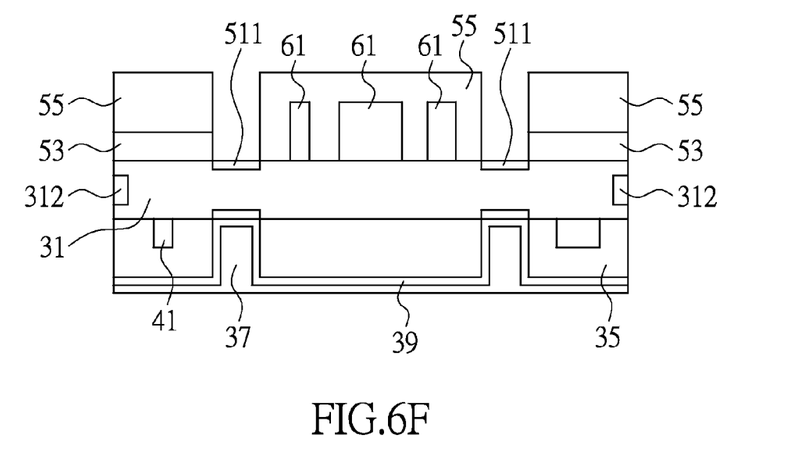
Figure 6G:
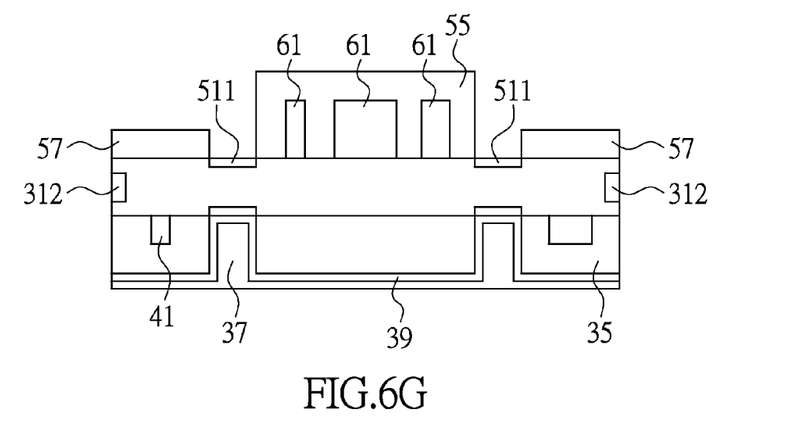

After the electronic component 61 is disposed on the second surface outside the predetermined area (i.e. the non-predetermined area), the molding member 55 can be formed as shown in FIG. 6F. Subsequently, the tape 53 and the molding member 55 are removed, and the ink 57 is formed on the predetermined above the second surface, as shown in FIG. 6G.

Figure 6H:
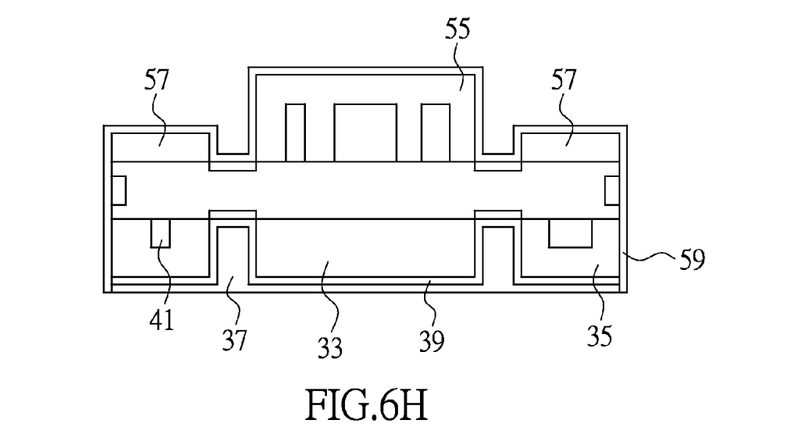

Furthermore, the entire circuit substrate can undergo the processing of EMI shielding layer 59 and then be cut into form individual modules. Alternatively, the entire circuit substrate can undergo cutting to form individual modules first and then processing the EMI shielding layer 59, such that the exterior of each individual module is formed with the EMI shielding layer 59, as shown in FIG. 6H.

Figure 6I:
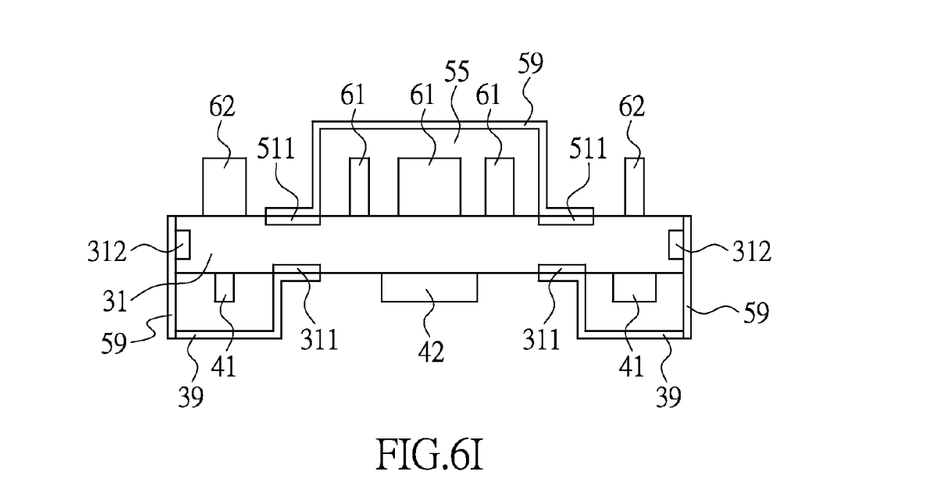

Following that, the ink 37, 57 are washed off, and the tape 33 is removed. The resulting circuit substrate 31 has selective molding at two sides and each side has complete EMI shielding layer 39, 59 respectively. Finally, the optoelectronic 62 is disposed on the predetermined area and the electronic module is complete, as shown in FIG. 6I.

It should be noted that the two-sided molding does not intend to limit the instant disclosure. If the predetermined areas of the two sides are both at the central region, a complete electromagnetic mask layer can be shared between the two sides. That is to say, the ink 37 and the EMI shielding layer 59 can be omitted. More specifically, the substrate undergoes the process up to the step as shown in FIG. 6C, and the EMI shielding layer 39 is formed to cover the entire substrate to simplify the process.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method of manufacturing an electronic module, comprising:
   providing a circuit substrate including a first surface, at least one first ground pad, and a first predetermined area, wherein the first ground pad and the first predetermined area are disposed on the first surface, and wherein the first ground pad surrounds the first predetermined area and does not overlap with the first predetermined area;
   forming a first tape onto the first predetermined area;
   disposing at least one first electronic component on the first surface outside the first predetermined area;
   forming a first molding member on the first surface, wherein the first molding member covers the first tape and the first electronic component;
   removing the first molding member on the first predetermined area; and
   removing the first tape.

2. The method of manufacturing an electronic module according to claim 1, wherein forming the first tape on the first predetermined area includes:
   attaching a tape on the entire circuit substrate;
   laser trenching the tape above the first ground pad; and
   removing the tape outside the first predetermined area.

3. The method of manufacturing an electronic module according to claim 1, wherein the first ground pad is located between the first electronic component and the first predetermined area, removing the first molding member further comprising:
   laser trenching the first molding member above the first ground pad; and
   laser trimming the first molding member above the first predetermined area.

4. The method of manufacturing an electronic module according to claim 1, wherein in removing the first tape, the first tape falls off by heating.

5. The method of manufacturing an electronic module according to claim 1, wherein the first tape is a UV tape film, and in removing the first tape, ultraviolet light shines on the first tape.

6. The method of manufacturing an electronic module according to claim 1 further comprising:
   disposing at least one of optoelectronic, connector, insertion hole or receptacle on the first predetermined area.

7. The method of manufacturing an electronic module according to claim 1, wherein after removing the first tape the method further comprising:
   forming a first mask layer on the first predetermined area;
   forming a first EMI shielding layer and electrically connected to the first ground pad; and
   removing the first mask layer.

8. The method of manufacturing an electronic module according to claim 1 further comprising:
   laser trenching the first molding member above the first ground pad, wherein the first ground pad is located between the first electronic component and the first predetermined area; and
   forming a first EMI shielding layer above the first molding member and the first ground pad.

9. The method of manufacturing an electronic module according to claim 1 further comprising:
   providing the circuit substrate including a second surface, at least one second ground pad, at least one second electronic component and a second predetermined area, wherein the second predetermined area, the second electronic component and the second ground pad are disposed on the second surface;
   forming a second tape on the second predetermined area;
   forming a second molding member on the second surface, wherein the second molding member covers the second tape and the second electronic component;
   removing the second molding member above the second predetermined area; and
   removing the second tape.

10. The method of manufacturing an electronic module according to claim 9, wherein forming the second tape on the second predetermined area includes:
    attaching a tape on the entire circuit substrate;
    laser trenching the tape above the second ground pad; and
    removing the tape outside the second predetermined area.

11. The method of manufacturing an electronic module according to claim 9, removing the second molding member further comprising:
    laser trenching the second molding member above the second ground pad, wherein the second ground pad is located between the second electronic component and the second predetermined area; and
    laser trimming the second molding member above the second predetermined area.

12. The method of manufacturing an electronic module according to claim 9, wherein in removing the second tape, the second tape falls off by heating.

13. The method of manufacturing an electronic module according to claim 9, wherein the second tape is a UV tape film, and in removing the second tape, ultraviolet light shines on the second tape.

14. The method of manufacturing an electronic module according to claim 9 further comprising:
    disposing at least one of optoelectronic, connector, insertion hole or receptacle on the second predetermined area.

15. The method of manufacturing an electronic module according to claim 9, wherein after removing the second tape the method further comprising:
    forming a second mask layer on the second predetermined area;
    forming a second EMI shielding layer and electrically connected to the second ground pad; and
    removing the second mask layer.

16. The method of manufacturing an electronic module according to claim 9 further comprising:
   laser trenching the second molding member above the second ground pad, wherein the second ground pad is located between the second electronic component and the second predetermined area; and
   forming a second EMI shielding layer, the second EMI shielding layer being electrically connected to the second ground pad.

17. The method of manufacturing an electronic module according to claim 1 further comprising:
   laser trenching the first molding member above the first ground pad, wherein the first ground pad has a first laser absorption level different from a second laser absorption level of the first molding member, and the first ground pad serves as a stop for the laser trenching.

18. The method of manufacturing an electronic module according to claim 1 further comprising:
   forming at least one side wall of the first molding member by laser trenching the first molding member above the first ground pad, wherein the at least one side wall of the first molding member and the first surface of the circuit substrate form an angle ranging between 85 degrees and 90 degrees.

* * * * *